(12) United States Patent
Parsadayan et al.

(10) Patent No.: US 7,108,172 B2
(45) Date of Patent: Sep. 19, 2006

(54) DISPLAY OF OPERATIONAL INSTRUCTIONS

(75) Inventors: Walter Parsadayan, Lake Forest, CA (US); Hagop Sakadjian, Mission Viejo, CA (US)

(73) Assignee: The Chamberlain Group, Inc., Elmhurst, IL (US)

( * ) Notice: Subject to any disclaimer, the term of this patent is extended or adjusted under 35 U.S.C. 154(b) by 0 days.

(21) Appl. No.: 10/865,103

(22) Filed: Jun. 10, 2004

(65) Prior Publication Data

US 2005/0274787 A1 Dec. 15, 2005

(51) Int. Cl.
*G06F 17/00* (2006.01)
(52) U.S. Cl. .................. 235/375; 206/701; 206/706; 206/716; 206/723
(58) Field of Classification Search ............. 200/5 A; 235/275; 206/701, 706, 716, 723
See application file for complete search history.

(56) References Cited

U.S. PATENT DOCUMENTS

| | | | |
|---|---|---|---|
| 3,978,328 A * | 8/1976 | Fabry et al. ............... 708/140 |
| 4,363,081 A | 12/1982 | Wilbur |
| 5,063,698 A | 11/1991 | Johnson et al. |
| 6,429,401 B1 * | 8/2002 | Corral ..................... 219/121.6 |
| 6,489,586 B1 * | 12/2002 | Corral ..................... 219/121.6 |
| 2001/0010503 A1 * | 8/2001 | Darbee et al. ............. 341/176 |
| 2002/0008631 A1 * | 1/2002 | Ross ....................... 340/815.4 |
| 2003/0221606 A1 * | 12/2003 | Quigley et al. ............ 116/286 |

* cited by examiner

*Primary Examiner*—Daniel Stcyr
*Assistant Examiner*—Daniel A. Hess
(74) *Attorney, Agent, or Firm*—Fitch, Even, Tabin & Flannery

(57) ABSTRACT

Information regarding electrical components and their use is provided with a foldable information sheet having instructions thereon. The sheet has apertures which fit over the electrical components and information is printed on the sheet in proximity to the electrical component or components to which it applies. A portion of the information sheet may be adhered to a planar surface on which the components are mounted and non-adhered portions of the information sheet may be folded over the components.

23 Claims, 4 Drawing Sheets

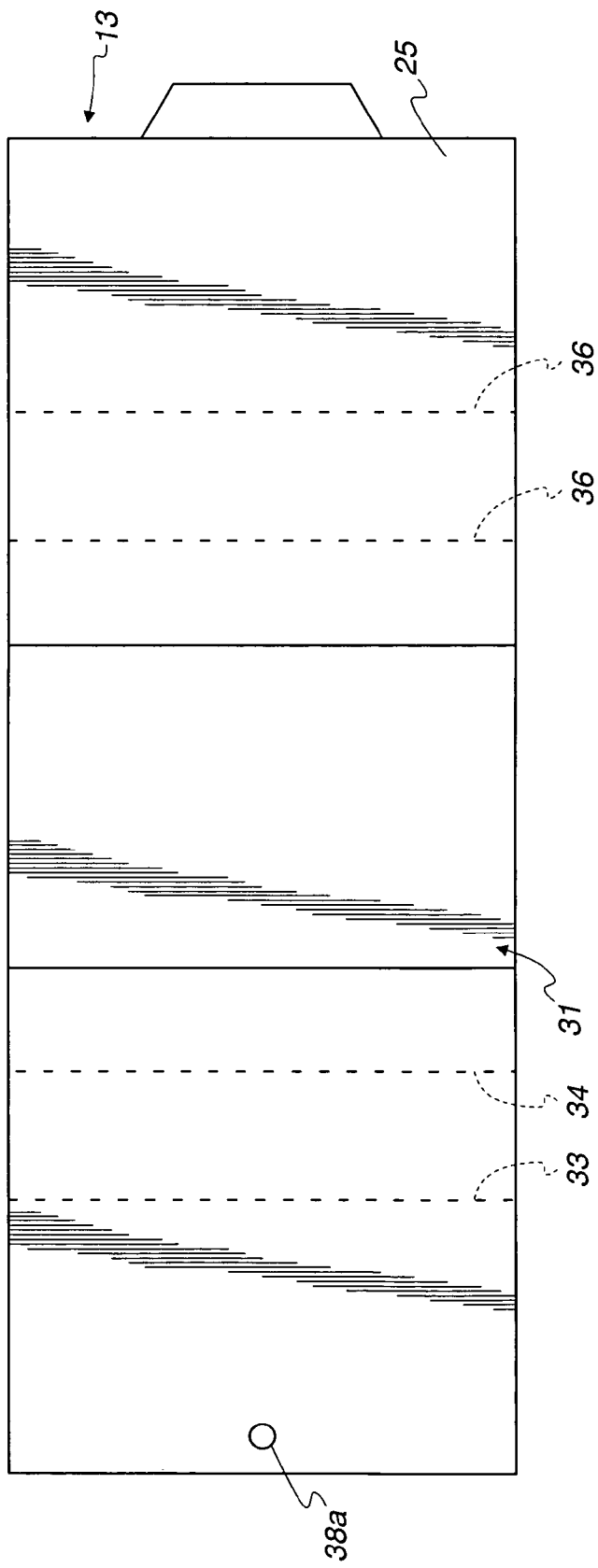
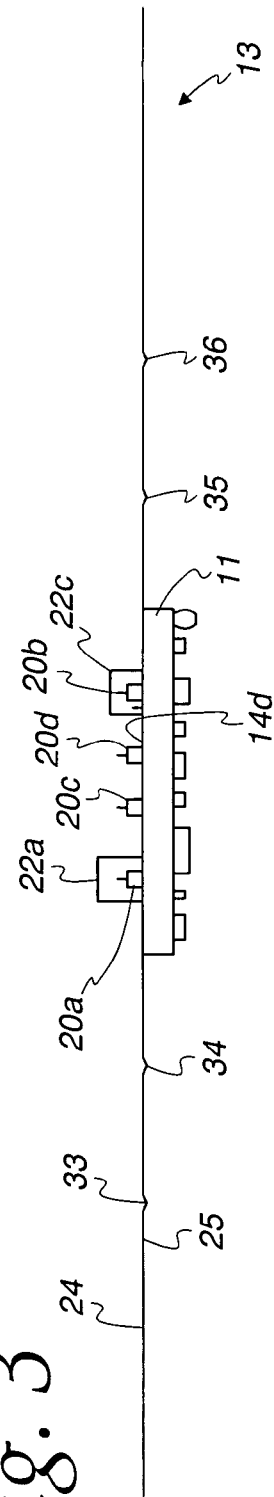

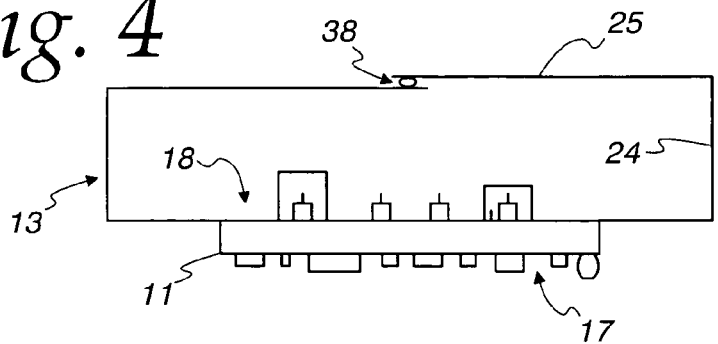
Fig. 4
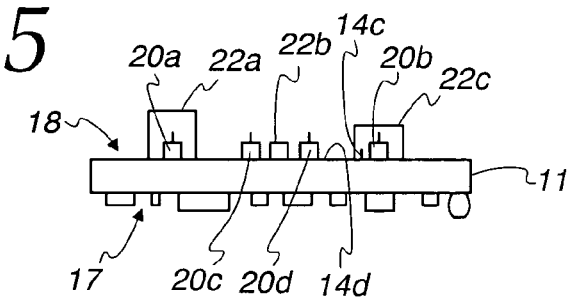
Fig. 5
Fig. 7
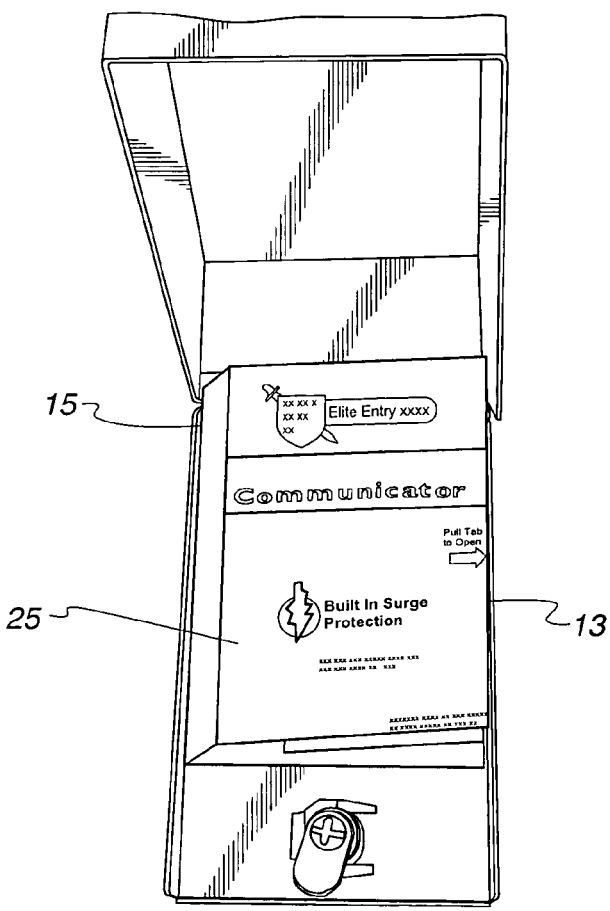

DISPLAY OF OPERATIONAL INSTRUCTIONS

The present invention relates to providing instructions for use with electrical circuits such as electronic circuit boards.

Many of the electrical circuits in use today require user interaction to set up and maintain the circuits for optimum performance. Also, many modern circuits are so "feature rich" that only a small amount of the circuit's capabilities are commonly used and the rest of the capabilities tend to be forgotten. When different sets of capabilities are needed, the circuit must be re-configured which is a difficult task when the user is trying to do so from memory.

Complicated circuitry is often shipped with an owner's or user's manual which provides instructions for set up and use. Such manuals are often misplaced over time and valuable resources are lost trying to find replacement manuals for previously purchased equipment. Further, even when the manual can be found its use may be difficult because of the mental translations required between pictures and words in the manual and the actual electrical circuits to be controlled.

In the case of electrical circuit boards some producers print the definitions of parts and sometimes instructions for use on the board itself. The circuit boards are however, fabricated to maximize the performance of the electrical circuit and to minimize its cost. Accordingly, a circuit board generally has little space available for meaningful information. What is needed in the art are improved methods and apparatus for providing electrical circuit related information to the user of such circuits.

BRIEF DESCRIPTION OF DRAWING

FIG. 2 shows a bottom surface of an information sheet;

FIG. 3 shows an end view of a circuit board with an open information sheet attached;

FIG. 4 shows an end view of a circuit board with a folded information sheet;

FIG. 5 shows a circuit board without information sheet;

FIG. 7 shows a folded information sheet attached to an electrical circuit.

DESCRIPTION

The present description relates to methods and apparatus for providing user information which is affixed to the circuit to which it pertains. The examples described relate to a wireless communication link circuit, however, it will be readily seen that the principles taught herein apply equally well to all other types of electrical circuits.

Figure 1:
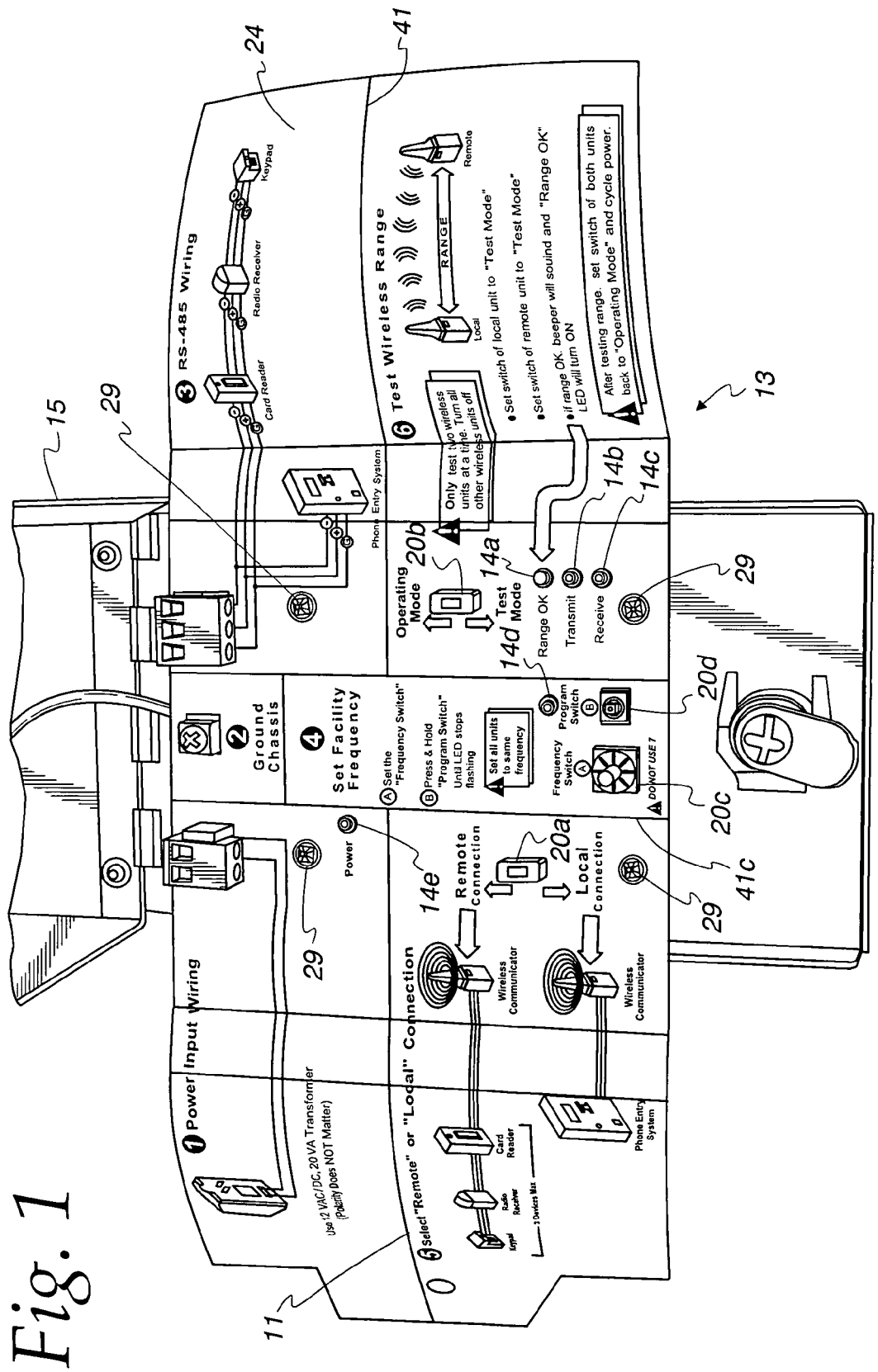
FIG. 1 shows an information sheet attached to an electrical circuit.

A circuit board 11 (FIG. 3) is shown in FIG. 1 which has an information sheet 13 attached hereto. As is described in greater detail later herein, information sheet 13 has disposed thereon, instructions for use of the circuit board 11 and in several places circuit elements of the circuit board protrude through the information sheet 13. The circuit board 11 and information sheet 13 are attached inside a circuit box 15, a portion of which is shown in FIGS. 1 and 7.

FIG. 5 shows an end view of circuit board 11 before the attachment of the information sheet. A bottom surface 17 of circuit board 11 is populated with the majority of the circuits required to provide a portion of a wireless communication link. The exact nature of the wireless communication link is not described herein as its understanding is not required for an understanding of the present invention. Certain electrical components of the wireless communication link are disposed on a top surface 18 of the circuit board. As illustrated in FIG. 1 the electrical components on the surface 18 comprise LEDs 14a–e, switches 20a–d and connectors 22a–c. The portion of the top surface 18 of the circuit board 11 not populated by electrical components is a substantially planar surface.

The particular electrical components of the wireless communication circuit which are placed on the top surface 18 are those which require some user interaction including user observation. In order to explain how the user should interact with the electrical components, an information sheet 13 (FIG. 6) is prepared. The information sheet 13 is made to be placed on the top surface 18 of circuit board 11 and includes apertures to fit over the electrical components e.g., 22a–c. For example, the information sheet 13 of FIG. 6 includes apertures 54a–e to fit over LEDs 14a–e, apertures 60a–d to fit over switches 20a–d and apertures 62a–c to fit over connectors 22a–c. Information sheet 13 (FIG. 6) may also include apertures 27 for use with screws 29 to attach the information sheet 13 to the top surface 18 of the circuit board. The bottom surface 25 of information sheet 13 is shown in FIG. 2. Bottom surface 25 may include an adhesive area 31 to adhere the information sheet to the substantially planar top surface 18 of the circuit board 11.

FIG. 3 shows circuit board 11 having an attached information sheet 13 with the electrical components e.g., 22a, protruding therethrough. The information sheet 13 may also include creases or fold lines 33–36 transverse to the width of the information sheet so that the information sheet can be folded to protect the electrical components e.g., 22a and form a more compact structure. FIG. 4 shows the information sheet 13 folded over the electrical components and fastened with a fastener 38. Fastener 38 may comprise mating hook and loop fastener portions 38a and 38b shown on the information sheet in FIGS. 2 and 6. The folded information sheet 13 is also shown in FIG. 7 where it is attached to the inside of circuit box 15. The information sheet 13 may be fabricated from any number of products depending on the environment in which it is to be placed. It has been found, however, that card board, plastic and laminated paperboard or paper perform well.

Figure 6:
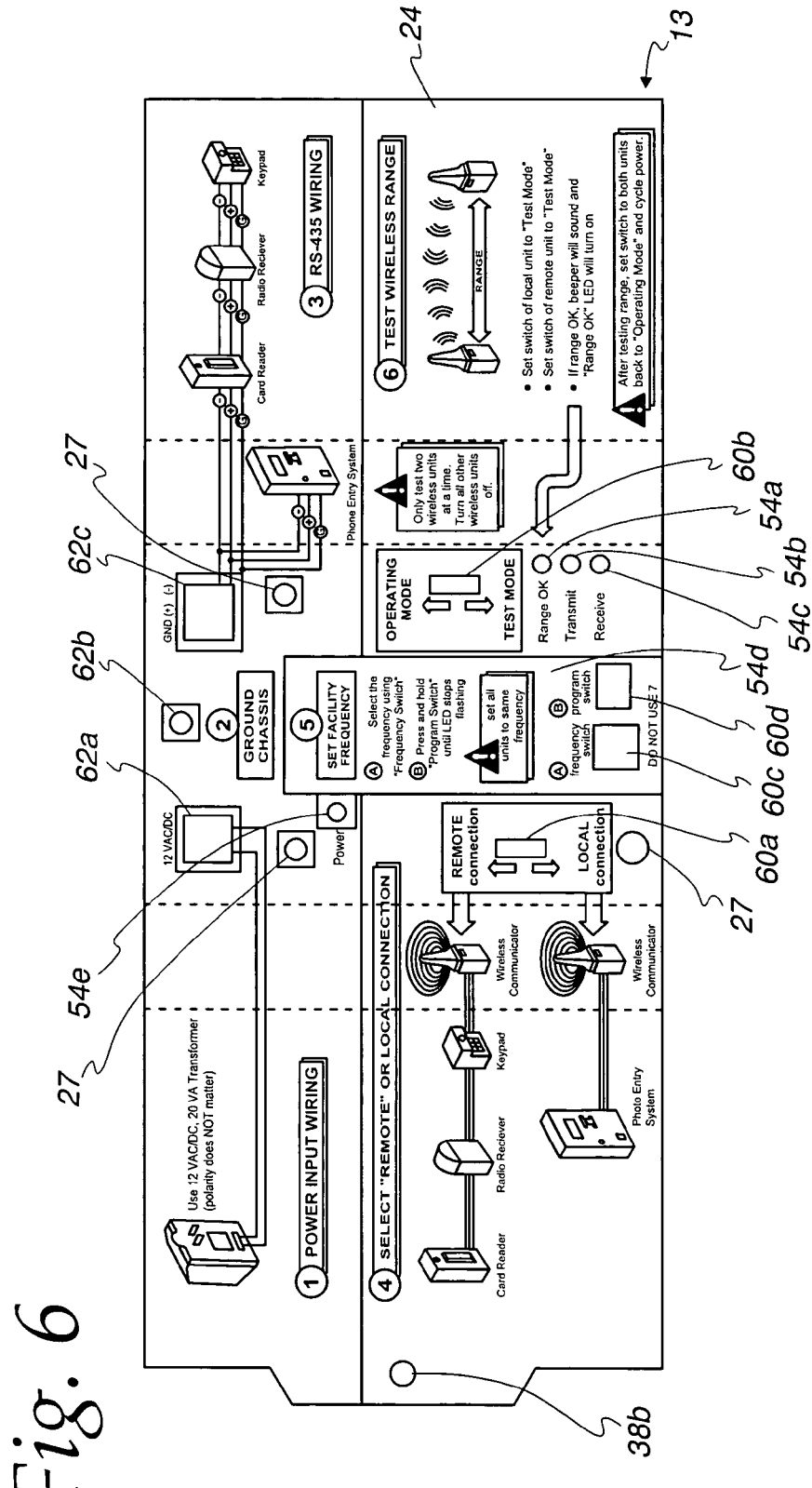
FIG. 6 shows a top surface of an information sheet.

When constructed as above described, an information sheet 13 which is capable of holding detailed instructions and information can be produced. Advantageously, information regarding a given electrical components e.g., 22a is placed on the information sheet in proximity to the aperture through which the given component will protrude. As shown in FIGS. 1 and 6 the top surface 24 of information sheet 13 is divided into six zones 1–6 separated by boundary lines 41. Differing shades of gray or colors could also be used to separate the zones. Zone 1 contains power input connector 22a and includes instructions for connecting incoming power. Zone 2 contains a ground connector 22b which is clearly labeled on the information sheet 13. Zone 3 contains network connector 22c and includes, in graphical form, how to connect to an RS-485 network. Zone 4 contains frequency switch 20c, program switch 20d and program LED 14d and instructions are provided for manipulating and observing those components to set a frequency. Zone 5 contains a connection switch 20a and graphical instructions for setting switch 20a for remote or local connection. Lastly, zone 6 contains mode switch 20b and LEDs 14a–c and includes both graphical and textual instructions for performing a test of transmission range and setting an operating mode. From the examples of FIGS. 1 and 6, a person of ordinary skill can use the principles of the present invention with many other types of circuits and provide other types of information and instructions as needed.

The invention claimed is:

1. Apparatus for displaying information in association with electrical components, comprising:
   an information sheet having a first and a second surface and having at least one aperture therethrough;
   means for attaching the information sheet to a substrate having at least one electrical component thereon, the electrical component having a top, the information sheet being attached in a position having the electrical component protruding through the information sheet;
   visual indicia disposed on the first surface of the information sheet in proximity to the electrical component, the indicia providing information relating to the electrical component; and
   the information sheet comprising a portion which is not secured to the substrate folds over the top of the electrical component and the substrate.

2. The apparatus of claim 1 wherein the information sheet comprises one of the following materials:
   plastic;
   laminated paperboard; and
   cardboard.

3. The apparatus of claim 1 wherein the aperture is shaped to fit closely around the electrical component.

4. The apparatus of claim 1 wherein a portion of the back side of the information sheet is secured to the substrate with an adhesive.

5. The apparatus of claim 1 wherein the substrate comprises a portion of a circuit board.

6. The apparatus of claim 1 wherein the electrical component comprises one of the following:
   a switch;
   an indicator; and
   an electrical connector.

7. The apparatus of claim 1 wherein the information describes at least one function of the electrical component.

8. The apparatus of claim 1 wherein the information sheet includes a plurality of creases such that the portion of the information sheet which is not secured to the substrate is foldable along the creases, over the electrical component protruding through the aperture in the information sheet.

9. The apparatus of claim 1 wherein the electrical component is connected as a functioning part of an electrical system and the visual indicia comprises a description of electrical connections.

10. The apparatus of claim 1 wherein the electrical component is connected as a functioning part of an electrical system and the visual indicia comprises a description for testing the electrical system.

11. The apparatus of claim 1 wherein the electrical component is an adjustable component connected as a functioning part of an electrical system and the visual indicia comprises instructions for adjusting the electrical component.

12. Apparatus for displaying information in association with electrical components, comprising:
   an information sheet having a first and a second surface and having at least one aperture therethrough;
   a substantially flat surface having at least one electrical component disposed thereon;
   adhesive disposed on the second surface of the information sheet for attaching the information sheet to the substantially flat surface in a position to allow the electrical component to protrude through the aperture in the information sheet;
   visual indicia disposed on the first surface of the information sheet in proximity to the electrical component, the indicia providing information relating to the electrical component; and
   wherein the electrical component has a top and the information sheet includes a plurality of creases such that a portion of the information sheet not adhered to the flat surface is foldable along the creases, over the top of the electrical component protruding through the information sheet and the top of the substrate.

13. The apparatus of claim 12 wherein the information sheet comprises one of the following materials:
   plastic;
   laminated paperboard; and
   cardboard.

14. The apparatus of claim 12 wherein each aperture is shaped to fit closely around the electrical component.

15. The apparatus of claim 12 wherein the substantially flat surface is comprised by a circuit board.

16. The apparatus of claim 12 wherein the electrical component comprises one of the following:
   a switch;
   an indicator; and
   an electrical connector.

17. The apparatus of claim 12 wherein the information describes at least one function of the electrical component.

18. The apparatus of claim 12 wherein the electrical component is a portion of an electrical circuit and visual indicia includes instructions on how to operate the electrical circuit.

19. Apparatus for displaying information in association with electrical connectors, comprising:
   an information sheet having a first and a second surface and having at least one aperture therethrough;
   means for attaching the information sheet to a substrate having at least one electrical connector thereon, the information sheet being attached in a position having the electrical connector protruding through the information sheet;
   visual indicia disposed on the first surface of the information sheet in proximity to the electrical connector, the indicia providing information relating to the connection of the electrical connector to further electrical apparatus; and
   wherein the electrical connector has a top and the information sheet includes a plurality of creases such that the portion of the information sheet which is not secured to the substrate is foldable along the creases, over the top of the electrical connector protruding through the aperture in the information sheet and the top of the substrate.

20. The apparatus of claim 19 wherein the information sheet comprises one of the following materials:
   plastic;
   laminated paperboard; and
   cardboard.

21. The apparatus of claim 19 wherein the aperture is shaped to fit closely around the electrical connector.

22. The apparatus of claim 19 wherein a portion of the second side of the information sheet is secured to the substrate with an adhesive.

23. The apparatus of claim 19 wherein the substrate is comprised by an electrical circuit board.

* * * * *